United States Patent
Templ et al.

(10) Patent No.: US 8,674,762 B2
(45) Date of Patent: Mar. 18, 2014

(54) RF POWER AMPLIFIER WITH SPECTRALLY GROUPED NANOSIZED SWITCHES

(75) Inventors: Wolfgang Templ, Sersheim (DE); Dirk Wiegner, Schwaikheim (DE)

(73) Assignee: Alcatel Lucent, Paris (FR)

( * ) Notice: Subject to any disclaimer, the term of this patent is extended or adjusted under 35 U.S.C. 154(b) by 63 days.

(21) Appl. No.: 13/499,695

(22) PCT Filed: Oct. 4, 2010

(86) PCT No.: PCT/EP2010/064717
§ 371 (c)(1),
(2), (4) Date: Mar. 31, 2012

(87) PCT Pub. No.: WO2011/045193
PCT Pub. Date: Apr. 21, 2011

(65) Prior Publication Data
US 2012/0200349 A1    Aug. 9, 2012

(30) Foreign Application Priority Data
Oct. 15, 2009    (EP) .................................... 09290788

(51) Int. Cl.
*H03F 3/217* (2006.01)
(52) U.S. Cl.
USPC ..................................... 330/207 A
(58) Field of Classification Search
USPC ............... 330/4.5, 4.9, 174, 207 A, 251
See application file for complete search history.

(56) References Cited

U.S. PATENT DOCUMENTS

| 3,413,573 A | 11/1968 | Nathanson et al. |
| 3,739,290 A | 6/1973 | Marshall et al. |

(Continued)

FOREIGN PATENT DOCUMENTS

GB    1 481 591 A    8/1977

OTHER PUBLICATIONS

Raskin et al., "A Novel Parametric-Effect MEMS Amplifier," Journal of Microelectromechanical Systems, IEEE Service Center, vol. 9, No. 4, XP011034596, pp. 528-537, Dec. 1, 2000.

(Continued)

*Primary Examiner* — Steven J Mottola
(74) *Attorney, Agent, or Firm* — Fay Sharpe LLP

(57) ABSTRACT

The invention describes a radio frequency (=RF) power amplifier (20), comprising—a coupling array (1) comprising a plurality of nano-sized coupling elements (2; 41; 51), wherein the coupling elements (2; 41; 51) are grouped into a number N of sub-arrays ($SA_{-1} \ldots SA_N$), with each sub-array ($SA_{-1} \ldots SA_N$) exhibiting·a specific resonance frequency ($f_1 \ldots f_N$) and·a specific attenuation of a mechanical self-oscillation of its coupling elements (2; 41; 51), wherein for the coupling elements (2; 41; 51) of each sub array ($SA_{-1} \ldots SA_N$), there is a stimulating means for stimulating a mechanical self-oscillation, —and a signal processing unit (22) for controlling the stimulating means with stimulating pulses having a pulse form and timing calculated by the signal processing unit (22) based on an evaluation of the spectral components of an RF signal to be amplified, namely the amplitudes ($C_1 \ldots C_N$) and phases ($\Phi_1 \ldots \Phi_N$) at the frequencies ($f_1 \ldots f_N$) corresponding to said specific resonance frequencies. The inventive RF power amplifier provides a high efficiency and a high linearity, in particular at high RF frequencies.

12 Claims, 5 Drawing Sheets

(56) References Cited

U.S. PATENT DOCUMENTS 6,611,168 B1 * 8/2003 Denison et al. ............... 330/4.5
7,619,469 B2 * 11/2009 Fischer et al. ................ 330/251

OTHER PUBLICATIONS

Piazza et al., "AIN Contour-Mode Vibrating RF MEMS for Next Generation Wireless Communications," Solid-State Device Research Conference, IEEE, XP031046993, pp. 61-64, Sep. 1, 2006.

Nguyen et al., "Integrated Micromechanical Circuits Fueled by Vibrating RF MEMS Technology," Ultrasonics Symposium, IEEE, XP031076428, pp. 957-966, Oct. 1, 2006.

Reichenbach at al., "A MEMS FR Phase and Frequency Modulator," Solid State Sensors, Actuators and Microsystems. Digest of Technical Papers, vol. 1, XP010828102, pp. 1059-1062, Jun. 5, 2005.

International Search Report for PCT/EP2010/064717 dated Nov. 24, 2010.

* cited by examiner

RF POWER AMPLIFIER WITH SPECTRALLY GROUPED NANOSIZED SWITCHES

BACKGROUND OF THE INVENTION

The invention relates to a radio frequency (=RF) power amplifier. Switched mode RF power amplifiers based on delta sigma modulators are e.g. known from M. Iwamoto et al., Electronics Letters, $8^{th}$ Jun. 2000, Vol. 36, No. 12, page 1010-1012.

Wireless communication systems of the 3rd generation ("3G") and later use modulation formats which yield RF (radio frequency) output signals featuring high peak to average ratios. The amplification of such signals imposes high requirements on power efficiency and linearity to the transmitter line up, especially for the final stage of the RF power amplifier, where by far the largest share of energy is dissipated.

So called switched amplifiers have a theoretical power efficiency of 100%, going along with high linearity. A switched amplifier is e.g. known from M. Iwamato, see above. M. Iwamato discloses a class S amplifier wherein a bandpass delta-sigma modulator (BPDSM) does a 1-bit A/D (analogue to digital) conversion, generating a fast pulse sequence which is fed into a transistor based switching amplifier. The output signal of the switching amplifier is fed into a bandpass filter for reconstruction purposes.

The physical realization of the switched amplifier concept, however, involves losses and signal distortion e.g. caused by the parasitics of the transistor based switching devices and the reconstruction filter. Examples are parasitic gate capacitance and non-zero on-resistance in the switching field effect transistor, device mismatch between components, and filter losses.

Additionally, the efficiency is often reduced due to limited coding efficiency in case of use of delta-sigma modulators. For the reconstruction filter, in particular in case of a BPDSM based Class-S amplifier, challenging termination requirements in the stop bands and also low insertion loss in the transmission band have to be guaranteed in order to achieve good Class-S performance.

It has been proposed to replace a transistor based switching device with an array of nano-switches, thus avoiding disadvantages which are caused by the analogue nature of a transistor, which has originally been designed as a device for amplification of analogue signals. The nano-switches of such an array are switched identically with the fast pulse sequence of the bandpass delta-sigma modulator. However, a reconstruction filter is still necessary, resulting in distortions and losses, and coding efficiency is still limited by the BPDSM.

OBJECT OF THE INVENTION

It is the object of the invention to provide an RF power amplifier which provides a high efficiency and a high linearity, in particular at high RF frequencies.

SHORT DESCRIPTION OF THE INVENTION

This object is achieved, in accordance with the invention, by a radio frequency (=RF) power amplifier, comprising
a coupling array comprising a plurality of nano-sized coupling elements, wherein the coupling elements are grouped into a number N of sub-arrays, with each sub-array exhibiting
a specific resonance frequency and
a specific attenuation of a mechanical self-oscillation of its coupling elements, wherein for the coupling elements of each sub array, there is a stimulating means for stimulating a mechanical self-oscillation,
and a signal processing unit for controlling the stimulating means with stimulating pulses having a pulse form and timing calculated by the signal processing unit based on an evaluation of the spectral components of an RF signal to be amplified, namely the amplitudes and phases at the frequencies corresponding to said specific resonance frequencies.

As the basic idea of the invention, the RF output signal is generated by composing its frequency components generated by means of nano-sized coupling elements, which act as mechanical oscillators at their resonance frequency each. When excited, each coupling element oscillates at its resonance frequency, and via the change of its coupling during an oscillation, the corresponding frequency component can be generated by modulating an externally applied supply voltage (providing electric power). This results in an inherent frequency-up conversion.

The exploitation of the self-resonance of the nano-sized coupling elements in the inventive coupling arrays allows for a completely different and disruptive approach for realization of a high efficient RF amplifier: The output signal is generated by the combination of spectral signal components which are generated by the controlled triggered self oscillations of nano-sized coupling elements ("switches"). Those coupling elements are grouped in a number of sub-arrays, characterized by specific physical parameters (geometrical dimension, material, suspension) of their coupling elements, wherein the physical parameters define the self resonance at a well defined frequency and attenuation. All coupling elements of the same sub-array have the same resonance frequency and the same attenuation, within the limits of the manufacturing tolerance. This concept allows to overcome the current available transmitter architecture in particular by omitting the digital-to-analog converter (such as a bandpass delta-sigma modulator) and the up-conversion module.

The invention combines the benefits of a switched amplifier, namely high efficiency, digital control, wide band operation, and efficient parallel operation of fragmented frequency bands, with the benefits of the analogue amplifiers, namely simplification or even avoidance of reconstruction filter with its non-idealities and matching losses. By means of the invention, an external reconstruction filter can be simplified or even be avoided together with its related matching circuitry in a switched power amplifier. Different from the class S switched amplifier, the inventive device does not involve sigma delta or comparable modulation. It features 100% coding efficiency. By this it contributes to an improved energy efficiency of the transmitter lineup while maintaining linearity. Additionally, by increasing the number of sub-arrays, the supported signal bandwidth can be large, and is in particular not limited by a digital-to-analog converter.

In general, each coupling element comprises a first mobile part and an opposing second part relative to which the first mobile part may mechanically oscillate (vibrate). Note that the second opposing part may also be mobile. The distance or overlap of the two parts determines the degree of coupling of the coupling element, which varies during the mechanical self oscillation of the coupling element. Typically, in a non-oscillating state (home state) of a coupling element, the coupling is low (and preferably practically zero). Preferably, the coupling elements are designed such that said two parts of the coupling element keep a spatial separation even in a tight coupling state in which their coupling is at its maximum, thus reducing wear. The coupling is typically based on electron emission or tunnelling effect; this results in a continuous dependency of the coupling with the distance or overlap of the parts of the coupling element.

A single coupling element, in accordance with the invention, typically has a maximum dimension of 1 μm or less. A mobile part of a coupling element typically has a maximum dimension of 800 nm or less. The dimensions of a coupling element are also chosen with respect to the material from which the coupling element or its mobile part is made. Note that there are in general a few hundreds or even thousands of coupling elements per sub-array, in order to be able to generate a high power RF output signal.

Typically, each coupling element has a separate stimulating means such as a piezo-electric coating; however, it is also possible to have a common stimulation means for a plurality of coupling elements of the same sub-array (e.g. when the stimulation means acts at a common suspension of the coupling elements).

The inventive RF power amplifier can be used as part of a transmitter arrangement, e.g. in base stations of mobile communication networks, in particular mobile telephony networks. The invention may be of particular use for radio transmitters in BTS and user terminal equipment, defense systems, consumer electronics, and software-Defined-Radio and Cognitive Radio applications.

PREFERRED VARIANTS OF THE INVENTION

In a highly preferred embodiment of the inventive RF power amplifier, the RF power amplifier comprises a number N of stimulating impulse generators, wherein each stimulating impulse generator controls the stimulating means of a sub-array, and wherein the stimulating impulse generators are controlled by the signal processing unit. An impulse generator may amplify a stimulating pulse of the signal processing unit and/or adapt it to the needs of the stimulating means of the connected sub-array. The impulse generators may be realized as piezo drivers, for example.

In a further preferred embodiment, the power amplifier comprises a feedback loop for analysing an RF output signal of the coupling array by the signal processing unit. By means of the feedback loop, the timing and shape of the stimulating pulses may be optimized to get a true (amplified) reconstruction of the signal to be amplified.

In a highly preferred embodiment, the stimulating means comprise a piezoelectric element, in particular a piezoelectric coating on a coupling element or part of a coupling element. With the piezoelectric element, a control voltage pulse may be transformed into a mechanical stimulus by simple means. A piezoelectric coating, in accordance with the invention, may be a plane one-sided coating of a first part of a coupling element, such as a first reed, wherein an applied voltage causes the first part of the coupling element to bend, e.g. upwards in case its upper side coating is piezoelectrically contracted (electrostriction). After the mechanical stimulus, the coupling element oscillates (swings) freely at its resonance frequency. The coupling of the first part to an opposing second part of the coupling element, such as a second reed, which is dependent on the distance of the two parts, varies during the self oscillation and thus allows to generate a signal with a frequency component of said resonance frequency.

A preferred embodiment provides that a coupling element comprises two parallel, opposing and partially overlapping reeds. Reeds are simple oscillators, whose resonance frequency is easy to calculate. In particular, nano-sized reeds may me produced by cost-efficient lithographic processes.

In a preferred further development of this embodiment, the two reeds are designed to keep a spatial separation even in a tight coupling state. This reduces wear. Note that also for other types of coupling elements, it is preferred to have a contact-less tight coupling.

In another embodiment, a coupling element comprises a membrane arranged opposite to a coupling surface, wherein during mechanical self oscillation, the distance between the membrane and the coupling surface varies. The membrane and the coupling surface may act as electron emission surface and receiver surface (or the other way around). By means of a membrane, larger overlap areas may be realized, allowing higher signal power generation. Note that the membrane material must be chosen adequately with respect to the desired resonance frequency.

Further, in an embodiment, a coupling element comprises
  a torsion unit with a first coupling surface covering only part of the torsion unit's circumference, and
  a jacket which at least partially houses the torsion unit, wherein the jacket comprises second coupling surface covering only part of the jacket's inner circumference. The coupling surfaces act as electron emission or receiver surfaces respectively. In the home state of the torsion unit, the coupling is typically low. The torsion unit may rotatively swing with respect to the jacket with one end of the torsion unit, whereas the opposing end remains fixed. By means of a torsion unit and jacket, the degree of coupling between a low coupling state (e.g. the home state) and a high coupling state can be varied particularly strongly.

In an advantageous embodiment of the inventive RF power amplifier, the coupling elements within the same sub-array have the same physical dimension and properties, thus featuring the same mechanical resonance frequency. By choosing identically designed coupling elements within each sub-array, the design may be particularly simple, and sharp resonances can be realized. Note that identical design of the coupling elements also results in the same attenuation of the mechanical self-oscillations.

Also within the scope of the present invention is the use of an inventive RF power amplifier in a telecommunication system, in particular in a base station of a mobile communication network. The inventive RF power amplifier can be used, in particular, in mobile telephony.

Further advantageous is the use of an inventive RF power amplifier in a fragmented transceiver architecture. Said fragmented transceiver architecture may in particular be used in telecommunication system applications. In the fragmented transceiver architecture, several RF power amplifiers are used in parallel, with each RF power amplifier handling its own frequency interval. Since the sub-arrays are already specialized for particular frequencies, the cooperation of inventive power amplifiers dedicated to different frequency bands is particularly simple and efficient.

Within the scope of the present invention is also a method for amplifying an RF signal, with the steps of
  analysing the spectral components, namely the amplitudes and the phases at different frequencies, of the RF signal to be amplified,
  applying a supply voltage, in particular a dc supply voltage, to a coupling array comprising a plurality of nano-sized coupling elements, wherein the coupling elements are grouped into a number N of sub-arrays, with each sub-array exhibiting
    a specific resonance frequency corresponding to a frequency component of the RF signal to be amplified and a specific attenuation of a mechanical self oscillation of its coupling elements, stimulating mechanical self-oscillations of the coupling elements of the sub-arrays in dependence of the spectral components of the RF signal to be amplified. The coupling array may be of the type described above in accordance with the invention. With the inventive method, the amplification of RF signals can be done with high efficiency and high linearity. The method exploits the self-resonances of nano-sized coupling elements for generating frequency components of an amplified RF signal.

In a preferred variant of the inventive method, the mechanical self-oscillations are stimulated also in dependence of an RF output signal of the coupling array. Thus a better precision in the reconstruction of the (amplified) RF signal can be achieved.

Further preferred is a variant wherein the amplification gain is regulated by the fraction of coupling elements of each sub-array which are stimulated. With this variant, the amplification gain of the inventive amplification method is simple to set. Further, said setting of the amplification gain is highly linear and efficient. Typically, the power of the RF input signal to be amplified is constant. Note that for this variant, each coupling element or at least groups of coupling elements of the same sub-array are equipped with separately controllable stimulating means.

Further advantages can be extracted from the description and the enclosed drawing. The features mentioned above and below can be used in accordance with the invention either individually or collectively in any combination. The embodiments mentioned are not to be understood as exhaustive enumeration but rather have exemplary character for the description of the invention.

DRAWING AND DETAILED DESCRIPTION OF THE INVENTION

The invention is shown in the drawing.

FIG. 2 shows schematically an embodiment of an inventive RF power amplifier, integrated in a transmitter arrangement and based on a coupling array comparable to the one shown in FIG. 1a;

FIG. 1a illustrates in a schematic, perspective view a coupling array 1 for an inventive RF power amplifier.

Figure 1A:
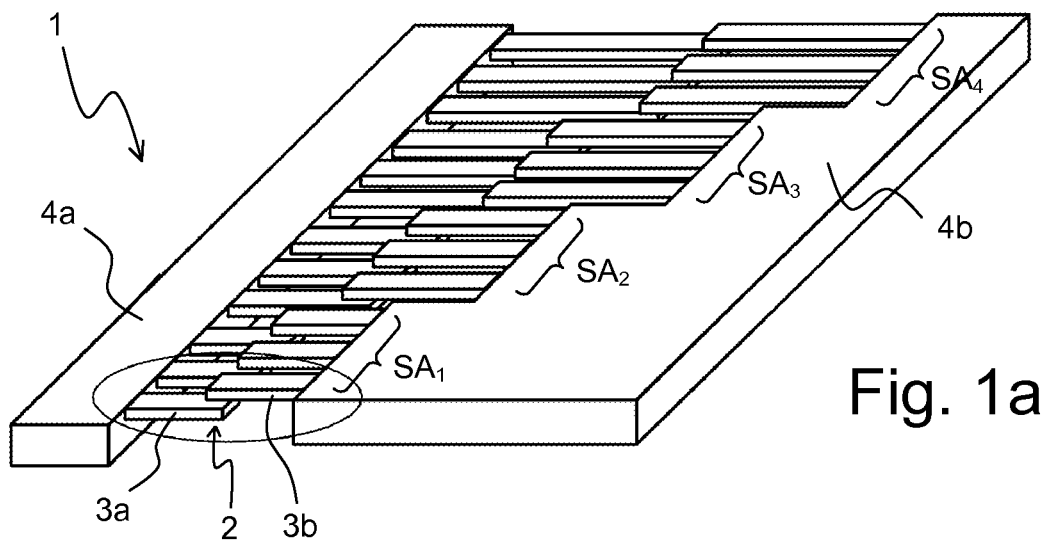
FIG. 1a shows schematically a coupling array of an inventive RF power amplifier with coupling elements based on switching reeds.
Figure 1B:
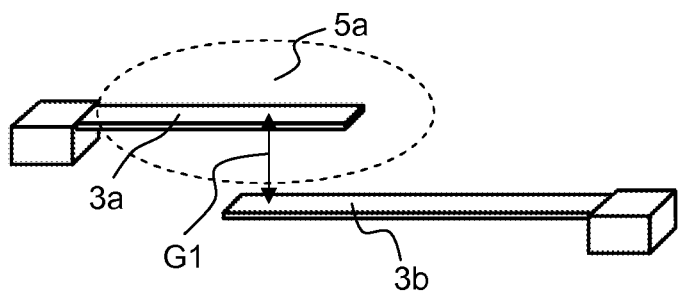
FIG. 1b shows a coupling element of FIG. 1a in a home state.
Figure 1C:
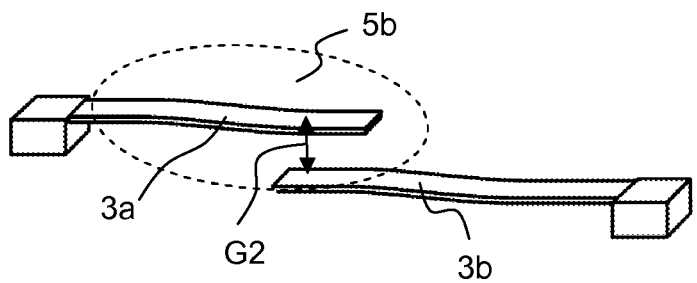
FIG. 1c shows a coupling element of FIG. 1a in a deflected state of increased coupling.

The coupling array 1 comprises a plurality of nano-sized coupling elements 2, here each with a first switching reed 3a and a second switching reed 3b, arranged separate and opposite to each other, but with some overlap in the region of their free ends (see FIG. 1b and 1c for more details). The ends of the reeds 3a, 3b facing away form the other reed 3a, 3b are fixed to a suspension 4a, 4b each; here common suspensions 4a, 4b for all reeds 3a, 3b of each respective one side of the coupling array 1 are used. The reeds 3a, 3b may oscillate with their free ends, perpendicularly to their shortest dimension, i.e. up and down in FIG. 1a.

The coupling elements 2 are grouped in sub-arrays $SA_1$-$SA_4$. In the schematic illustration of FIG. 1a, four sub-arrays $SA_1$-$SA_4$ with each sub-array $SA_1$-$SA_4$ having three coupling elements 2 are shown for simplicity; however in practical implementations there are much more sub-arrays (typically a thousand or more) and much more coupling elements per sub-array (typically several thousands). The number N of sub-arrays and the number of coupling elements 2 per sub-array depends on the required bandwidth, the required frequency resolution, the required signal output power and the electrical characteristics of the coupling contacts.

Within each sub-array $SA_1$-$SA_4$, the coupling elements 2 have the same physical dimensions and properties, and therefore exhibit the same resonance frequency $f_1$-$f_4$ and the same attenuation (within the manufacturing tolerance). In the example shown, the length of the reeds 3a, 3b increases from the first (front) sub-array $SA_1$ to the last (rear) sub-array $SA_4$, giving the coupling array 1 a harp-like design.

Since each sub-array (or group) of coupling elements ("switches") represents a distinct resonance frequency given by $$\omega \propto \sqrt{\frac{E}{\rho}} \frac{d}{l^2}$$

(with E=Young's modulus, $\rho$=specific mass, d=thickness of reed, L=length of reed, w=$2\pi f$), there is a plurality of N sub-arrays (only four of which are shown in FIG. 1a, namely $SA_1$-$SA_4$) to compose the wanted RF output signal from its frequency components $\omega_n$, with n=1 ... N, wherein N is the number of discrete frequency component bins in the RF input signal to be amplified. Note that in this way the frequency up-conversion is performed inherently, because the self oscillation frequencies of the structure are centred at the RF carrier.

Figure 3:
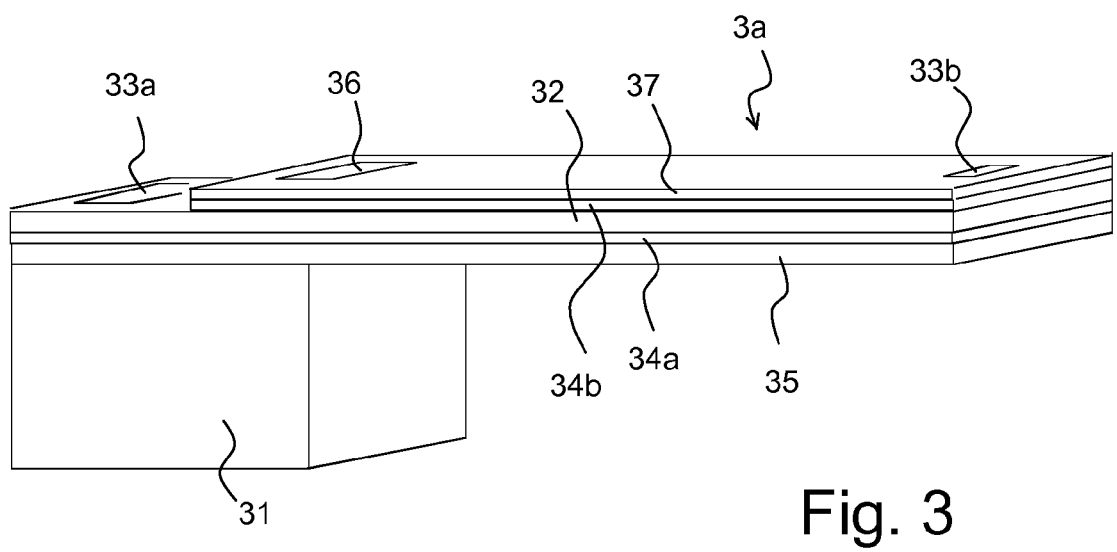
FIG. 3 shows schematically a switching reed of the embodiment of FIG. 1a, with a piezoelectric coating.

A coupling element 2 may be triggered to a self oscillation by an ultra-short electrical impulse, which is converted into a mechanical stimulating impulse through piezoelectric conversion, enabled by an appropriate piezo-active coating of the contact reeds (see FIG. 3).

The oscillation of the reeds 3a, 3b of a coupling element 2 (compare FIG. 1, oval marking) is illustrated in FIGS. 1b and 1c.

In FIG. 1b, a home state (undeflected state) of the reeds 3a, 3b is shown. In the example shown, the left reed 3a is connected to the negative pole, and the right reed 3b is connected to the positive pole of a constant voltage supply (not shown). In the undeflected state, the reeds 3a, 3b are separated by a relatively large gap G1, and accordingly, the electric field strength between the reeds 3a, 3b is relatively low. As a result, there is only a low (and practically negligible) electron emission current form reed 3a to reed 3b. In FIG. 1b, there is also indicated an area 5a around the reed 3a in which significant electron tunneling to an opposing (neighboring) reed may occur at the given voltage. Since the reed 3b is outside the area 5a, there is also no significant tunneling current from reed 3a to reed 3b. In summary, in the undeflected state of FIG. 1b, there is only a low and practically zero coupling of the reeds 3a, 3b.

FIG. 1c shows the reeds 3a, 3b in a deflected state, wherein the reeds 3a, 3b have approached each other with their free ends (the free end of reed 3a is bent downwards, and the free end of reed 3b is bent upwards); this approached state is reached during each self oscillation of the reeds (note that the reeds 3a, 3b here oscillate at the same frequency and at a fixed phase shift of) 180°. The remaining gap G2 is relatively small as compared to G1, and typically on the order of only a few nanometers. In accordance with the relatively small gap G2, the electric field strength between the reeds 3a, 3b has increased. As a result, there is an increased electron emission current from reed 3a to reed 3b, as compared to the undeflected state of FIG. 1b. In order to increase the electron emission current, the reeds 3a and/or 3b may be made from or coated with a material of low or negative electron affinity (e.g. diamond). Further, the area 5b around reed 3a in which significant electron tunneling may occur from reed 3a to an opposing reed has been bent downward towards the reed 3b, such that the free end of reed 3b is now within the area 5b; therefore a significant tunneling current will flow from reed 3a to reed 3b. In summary, in the deflected state of FIG. 1c, there is a good coupling between the reeds 3a and 3b and thus a good electrical conductivity between the two reeds 3a, 3b for a supplied voltage and a corresponding power current, respectively.

Figure 2:
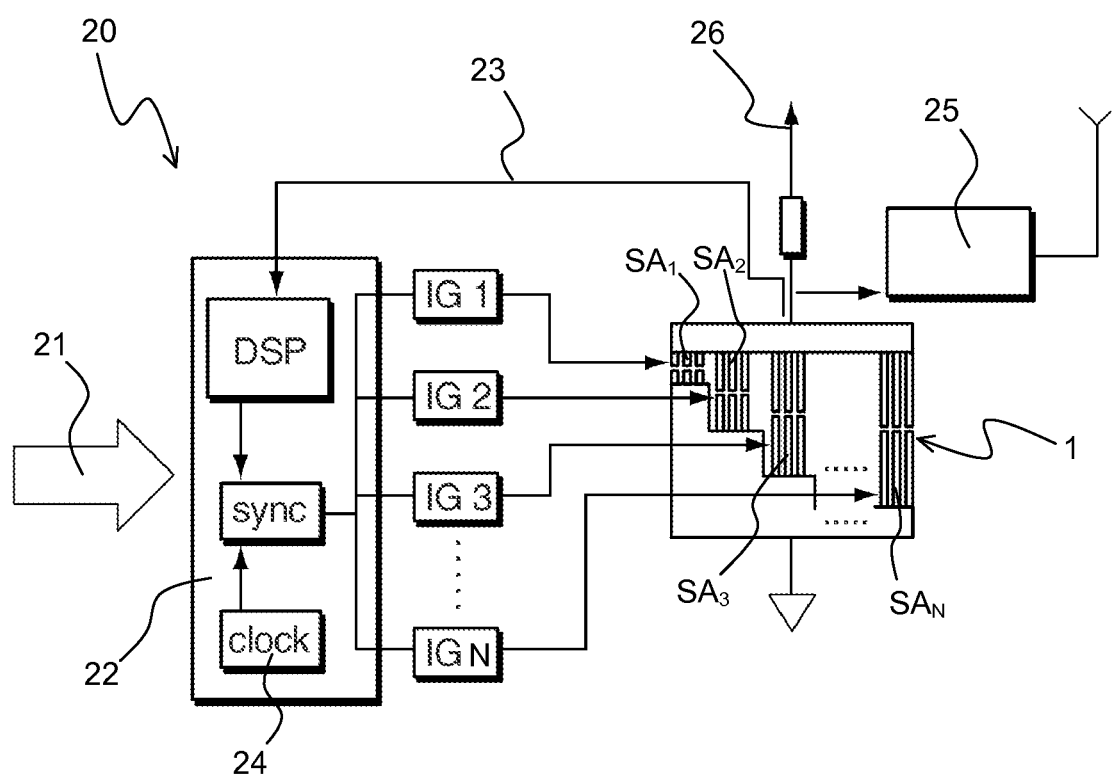

FIG. 2 shows an exemplary embodiment of the electrical setup of the inventive RF power amplifier 20.

The RF power amplifier 20 comprises a signal processing unit 22, which receives information 21 about the spectral components (i.e. frequencies $f_1 \ldots f_N$, amplitudes $c_1 \ldots c_N$ and phases ($\Phi_1 \ldots \Phi_N$) of an RF input signal to be amplified (Note that in accordance with the invention, it is also possible to have an analyzing unit integrated in a signal processing unit wherein the analyzing unit identifies the spectral components of an RF input signal to be amplified which is directly fed to the signal processing unit). With this information 21, the signal processing unit 22 calculates the pulse form and timing for stimulating pulses. In the example shown, this information is sent to stimulating impulse generators $IG_1 \ldots IG_N$, with one stimulating impulse generator $IG_1 \ldots IG_N$ for each sub-array $SA_1 \ldots SA_N$ of the coupling array 1. The stimulating impulse generators $IG_n$ create stimulating pulses for their respective sub-array $SA_n$, each, based on the pulse form and timing information from the signal processing unit 22. The amplitude of the stimulating pulse determines the power of the spectral component and the timing determines its phasing. The calculation of the pulse form and timing is based on the spectral input information on baseband level, a fed back sample (see feedback loop 23) of the RF output signal, and a reference clock 24. The resonance frequencies $f_1 \ldots f_N$ of the coupling elements within the sub-arrays $SA_1 \ldots SA_N$ are fixed and correspond to the frequencies of the analyzed spectral components of the RF input signal. In the example shown, the RF output signal is fed into an antenna network 25.

The supply voltage (electrical power) applied at supply input 26, here a direct current (dc) supply voltage, is lead through the coupling array 1, facing a resistance in dependence of the coupling within the sub-arrays $SA_1$-$SA_N$ of the coupling elements incorporated therein. The sub-arrays $SA_1$-$SA_N$ are electrically connected in parallel.

As an example, an inventive RF power amplifier 20 may apply a frequency resolution in equal steps of between 1 kHz and 50 kHz, with a typical width of a resolved frequency interval of between 1 MHz and 50 MHz. The center frequency of the RF input signal to be amplified is typically between 500 MHz and 10 GHz. For example, with a frequency resolution of 50 kHz and a width of 50 MHz, the coupling array 1 comprises about 1000 sub-arrays, i.e. N=1000.

FIG. 3 shows in a schematic, perspective view the layer structure (coating structure) of a reed 3a as shown in FIG. 1a, by way of example. On a coupler contact 31 (which may be part of the suspension 4a in FIG. 1a), the reed 3a is mounted at one (left) end; the other (right) end extends freely away from the coupler contact 31.

The base structures of the reed 3a here are a layer (or coating) supporting electron emission 35 ("emission layer") and a piezoactive layer (or coating) 32. The emission layer 35 is directly attached to the coupler contact 31 to electrically connect the emission layer 35 to a voltage supply (not shown) and faces the other reed (compare FIG. 1b for example, reed 3b). The emission layer 35 and the piezoactive layer 32 are separated by an insulating layer 34a, such as an oxide layer. On top of the piezoactive layer 32, there is another insulating layer 34b and a metallization 37.

The piezoactive layer 32 may be electrically contacted at its left (exposed) end via a first piezo contact 33a, and at its right (covered) end via a second (window) contact 33b reaching through the upper insulating layer 34b. The second (window) contact 33b is electrically connected via the metallization 37 to a metallization contact 36 in the region of the coupler contact 31 such that the areas of immediate connection to an external piezo voltage supply, namely the first contact 33a and the metallization contact 36, are well reachable and are not exposed to deflection during a reed oscillation.

By applying a voltage across the piezo-electric coating 32, the piezo-electric coating 32 may e.g. be contracted whereas the emission layer 35 remains at its original length, resulting in an upward-bending of the reed 3a at its free right end. After the voltage application has ended, the reed 3a will oscillate at its resonance frequency, causing a coupling varying with the resonance frequency. Note that the reed 3a may comprise an additional layer, in particular in order to deposit both the emission layer and the piezoactive layer as coatings on the additional layer, and/or to better control the mechanical properties (such as the resonance frequency via a dominant specific mass) of the reed 3a. It is also noted that piezoelectric multilayer structures may be applied instead of a single piezoactive layer 32. Note that the resonance frequency of a coupling element and here are reed 3a, in accordance with the invention, is typically in the GHz range.

Figure 4:
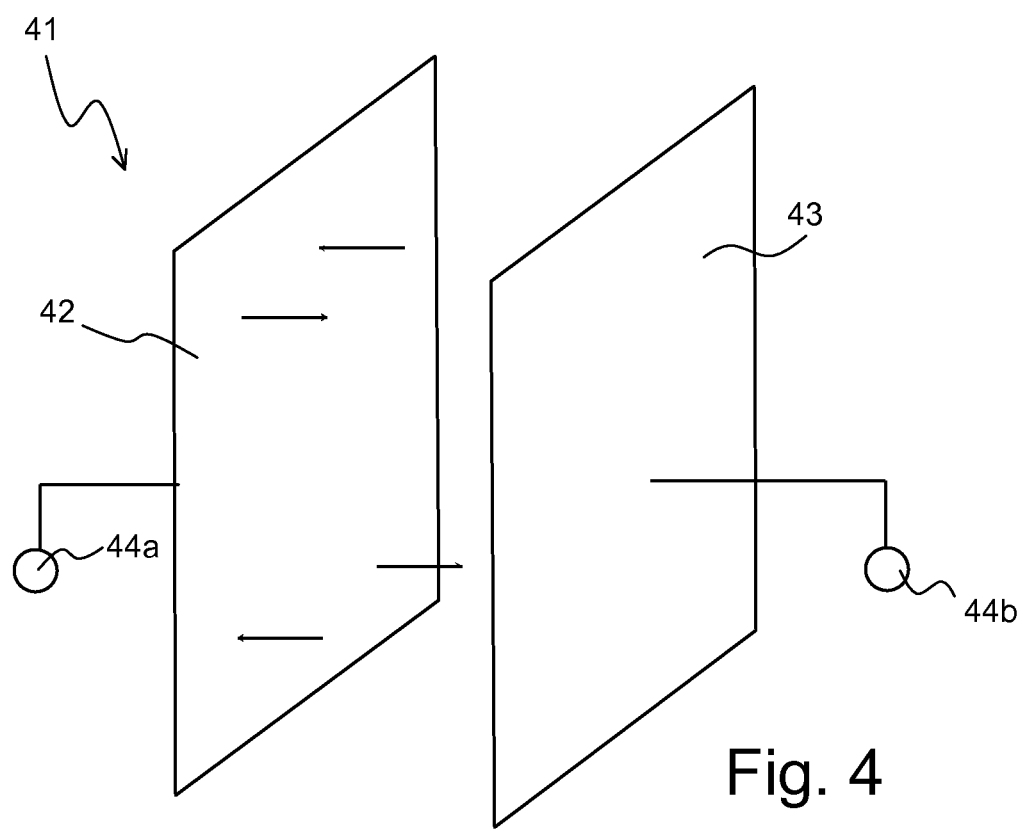
FIG. 4 shows schematically a coupling element for an inventive RF power amplifier, based on a membrane.

FIG. 4 shows a simple membrane-based coupling element 41. The coupling element 41 comprises a membrane 42 arranged opposite to a stiff coupling surface 43 (note that alternatively the coupling surface 43 may be realized on another movable membrane). The membrane 42 may oscillate at its resonance relative to the coupling surface 43, e.g. in the way indicated by the arrows. As a result, electrical current flowing through the coupling element 41 (see electrical contacts 44a, 44b) will oscillate with a frequency corresponding to the resonance frequency of the membrane 42. In order to initiate the self oscillation, the membrane 42 has a piezoelectric coating (not shown).

Figure 5:
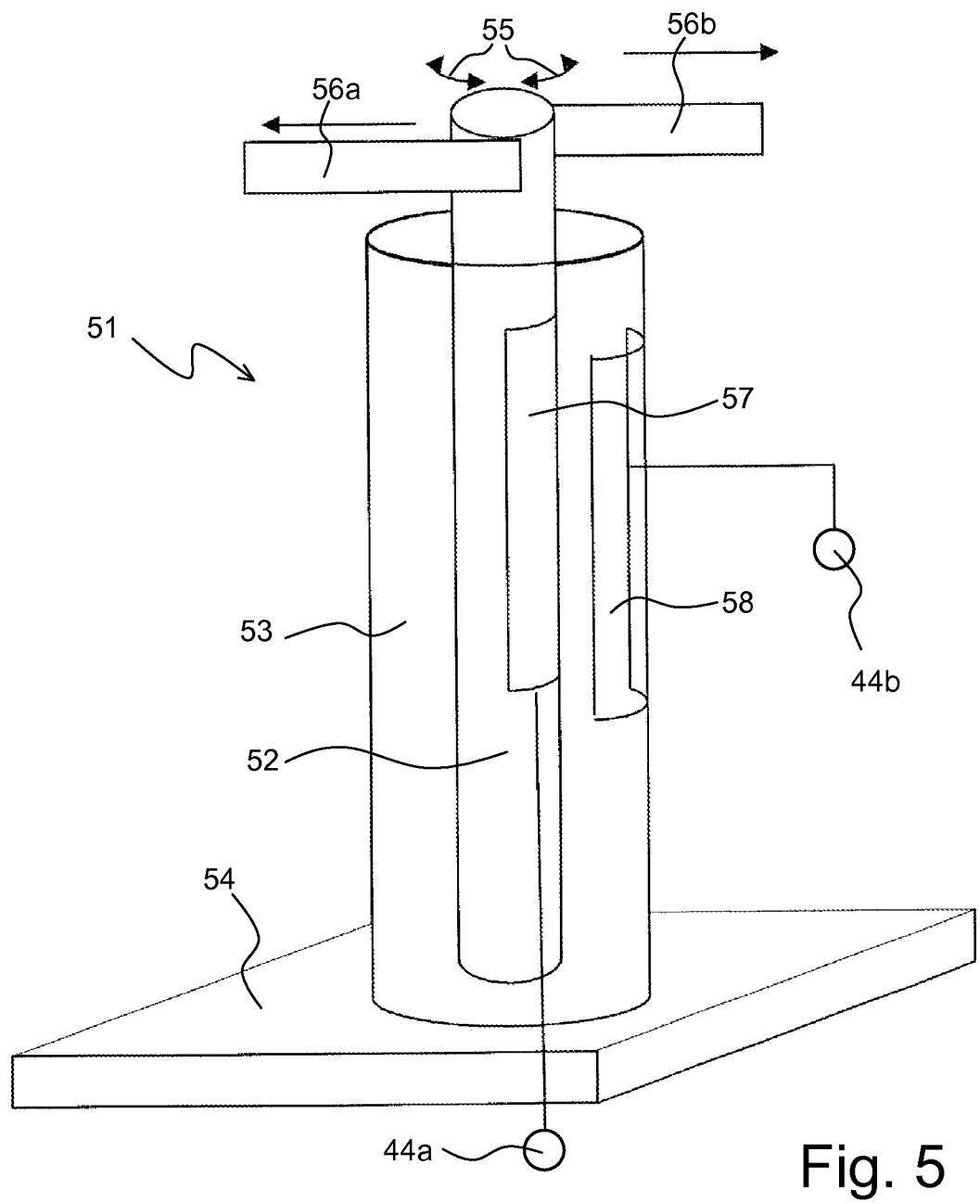
FIG. 5 shows schematically a coupling element for an inventive RF power amplifier, based on a torsion element and a jacket.

FIG. 5 illustrates a further coupling element 51, based on a torsion unit 52 and a jacket 53. On a fixed mounting 54, the torsion unit 52 (here of a rod-type shape) and the jacket 53, which surrounds the torsion unit 52, are fixed with their lower ends. The torsion unit 52, or more specifically its upper end, may be twisted (elastically rotated) around its vertical axis (see arrows 55); upon a deflection, the torsion unit 52 will exhibit a torsion oscillation at its resonance frequency. A torsion oscillation may be triggered by means of a two-part torsion impulsion (drive) 56a, 56b.

On the outer surface of the torsion unit 52, there is a first coupling surface 57, which covers about one third of the torsion unit's circumference. Further, on the inner surface of the jacket 53, there is a second coupling surface 58, covering about one tenth of the inner surface's circumference. The first coupling surface 57 and the second coupling surface 58 have about the same area size here. The coupling surfaces 57, 58 are connected to a power supply and an RF signal output (see contacts 44a, 44b). During an oscillation, the two coupling surfaces 57, 58 vary their overlap (and distance), and thus the coupling varies with the resonance frequency of the torsion oscillation.

The proposed invention realizes a highly efficient and highly linear power amplifier which furthermore does not require a D/A converter and an up-conversion module any more, in contrast to state of-the-art RF power transmitter architectures. Moreover, a reconstruction filter is not required with the inventive RF power amplifier. A large signal bandwidth can more easily be supported by simply increasing the number of sub-arrays. Additionally, fragmented transceiver architecture (parallel operation of fragmented frequency bands) becomes feasible, without decreasing efficiency, as this is true for conventional wideband amplifiers, e.g. based on Class-AB operation.

The invention claimed is:

1. A radio frequency (=RF) power amplifier, comprising
a coupling array comprising a plurality of nano-sized coupling elements
wherein the coupling elements are grouped into a plurality of sub-arrays, with one or more sub-arrays exhibiting
a specific resonance frequency and
a specific attenuation of a mechanical self-oscillation of one or more coupling elements,
wherein the one or more coupling elements of a sub array, comprise a stimulator configured to stimulate a mechanical self-oscillation,
and a signal processing unit configured to control the stimulator with stimulating pulses having a pulse form and timing calculated by the signal processing unit based on an evaluation of the spectral components of an RF signal to be amplified, wherein the spectral components comprise at least the amplitudes and phases at the frequencies corresponding to said specific resonance frequencies.

2. The RF power amplifier according to claim 1, further comprising a plurality of stimulating impulse generators, wherein one or more stimulating impulse generators control the stimulator of a sub-array, and wherein the stimulating impulse generators are controlled by the signal processing unit.

3. The RF power amplifier according to claim 1, further comprising a feedback loop for analyzing an RF output signal of the coupling array by the signal processing unit.

4. The RF power amplifier according to claim 1, wherein the stimulator comprises a piezoelectric element, comprising a piezoelectric coating on a coupling element or part of a coupling element.

5. The RF power amplifier according to claim 1, wherein a coupling element comprises two parallel, opposing and partially overlapping reeds.

6. The RF power amplifier according to claim 5, wherein the two reeds are designed to keep a spatial separation even in a tight coupling state.

7. The RF power amplifier according to claim 1, wherein a coupling element comprises a membrane arranged opposite to a coupling surface, wherein during mechanical self oscillation, the distance between the membrane and the coupling surface varies.

8. The RF power amplifier according to claim 1, wherein a coupling element comprises:
a torsion unit with a first coupling surface covering only part of a circumference of the torsion unit, and
a jacket which at least partially houses the torsion unit, wherein the jacket comprises second coupling surface covering part of an inner circumference of the jacket.

9. The RF power amplifier according to claim 1, wherein the coupling elements within sub-array have the same physical dimension and properties and the same mechanical resonance frequency.

10. A method for amplifying a radio frequency (RF) signal, the method comprising:
analyzing the spectral components, wherein the spectral components comprise at least the amplitudes and the phases at different frequencies of an RF signal to be amplified,
applying a supply voltage comprising a dc supply voltage to a coupling array comprising a plurality of nano-sized coupling elements,
wherein the coupling elements are grouped into a plurality of sub-arrays, with one or more sub-arrays exhibiting
a specific resonance frequency corresponding to a frequency component of the RF signal to be amplified and
a specific attenuation of a mechanical self oscillation of its coupling elements
stimulating mechanical self-oscillations of one or more coupling elements of the sub-arrays in dependence of the spectral components of the RF signal to be amplified.

11. The method according to claim 10, wherein the mechanical self-oscillations are stimulated also in dependence of an RF output signal of the coupling array.

12. The method according to claim 10, wherein the amplification gain is regulated by the fraction of coupling elements of the sub-arrays which are stimulated.

* * * * *